United States Patent

Ramamurthi

[11] Patent Number: 5,877,943
[45] Date of Patent: Mar. 2, 1999

[54] CLUSTERING ADAPTER FOR SPHERICAL SHAPED DEVICES

[75] Inventor: Ram Ramamurthi, Allen, Tex.

[73] Assignee: Ball Semiconductor, Inc., Allen, Tex.

[21] Appl. No.: 48,719

[22] Filed: Mar. 26, 1998

[51] Int. Cl.⁶ .............................. H05K 7/02; H01L 29/06
[52] U.S. Cl. ......................... 361/783; 361/736; 361/767; 361/768; 257/618; 257/678; 257/686; 257/730; 257/737; 438/109; 438/125; 438/613; 439/68; 174/52.1
[58] Field of Search ..................................... 361/767, 785, 361/768, 736, 783, 807, 809, 777, 773; 257/99, 618, 619, 678, 684, 798, 730, 685, 686, 692, 693, 737, 738; 439/8, 71, 68, 55; 438/106, 109, 125, 613; 174/52.1

[56] References Cited

U.S. PATENT DOCUMENTS

| | | | |
|---|---|---|---|
| 3,328,741 | 6/1967 | Brown | 439/8 |
| 3,459,873 | 8/1969 | Harris et al. | 439/8 |
| 4,036,543 | 7/1977 | Taketomi | 439/8 |
| 4,094,751 | 6/1978 | Nozik | 205/638 |
| 5,018,980 | 5/1991 | Robb | 439/8 |

Primary Examiner—Leo P. Picard
Assistant Examiner—John B. Vigushin
Attorney, Agent, or Firm—Haynes and Boone, L.L.P.

[57] ABSTRACT

An apparatus and method for connecting and interconnecting spherical ICs. The apparatus includes an enclosure which is used to hold and secure one or more spherical ICs or to connect to a device such as a printed circuit board. The enclosure includes two groups of electrical contact points. These contact points may be solder bumps, pads, leads, or any other type of connector. One group of contact points on the enclosure aligns and connects with a corresponding set of contact points on the first spherical shaped IC and the other group of contact points on the enclosure aligns and connects with a corresponding set of contact points on the other device. The two groups of enclosure contact points are interconnected with each other through a circuit located inside the enclosure. As a result, alignment is no longer required by the contact points on the spherical shaped IC and the other device.

23 Claims, 3 Drawing Sheets

CLUSTERING ADAPTER FOR SPHERICAL SHAPED DEVICES

BACKGROUND OF THE INVENTION

The invention relates generally to electronic interconnect devices, and more particularly, to an apparatus and method for connecting contact points on a spherical shaped device to other devices or components.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

In co-pending U.S. patent application Ser. No. 08/858,004 filed on May 16, 1997, assigned to the same assignee as the present application and hereby incorporated by reference, a method and apparatus for manufacturing spherical-shaped semiconductor integrated circuits ("spherical ICs") is disclosed. Included in the reference is a description of how spherical ICs can be mounted to each other and/or to a printed circuit board.

For example, referring to FIG. 1, several different spherical ICs 1, 2, 4, 6, 8, 10, 12 are shown. As a finished product, the spherical ICs 1–12 have solder bumps arranged at predefined intervals throughout their surface. The spherical ICs 1–8 can be easily mounted to a circuit board 14, a bottom portion of each spherical IC resting directly on the circuit board. The spherical IC 1 has solder bumps 16 arranged in a relatively small circle so that the spherical IC 1 can be mounted to the flat circuit board 14. The spherical ICs 2, 4 each have a first set of solder bumps 18, 20, respectively, for mounting to the circuit board 14 and a second set of solder bumps 22, 24, respectively, for connecting to each other. The spherical IC 6 has many solder bumps 26. To electrically connect each solder bump 26 to the circuit board 14, the spherical IC 6 is placed into a socket 28. The socket 28 has pads 30 that align with the solder bumps 26 and electrical connections 32 on a bottom surface for connecting the pads to the circuit board 14. The spherical IC 8 has solder bumps 34, 36, the spherical IC 10 has solder bumps 38, 40, and the spherical IC 12 has solder bumps 42, so that the spherical ICs may connect to the board and to each other, as shown.

However, there is often not a one-to-one alignment between the solder bumps of any two different spherical ICs or a spherical IC and a circuit board. Also, the spacing between solder bumps on one spherical IC may be different from the spacing of the solder bumps on another. Therefore, certain solder bumps may not properly align to corresponding bumps on another spherical IC or circuit board. For example, a positive power supply bump on one spherical IC may improperly align with a negative power supply bump on another.

SUMMARY OF THE INVENTION

The present invention, accordingly, provides an apparatus and method for connecting and/or interconnecting spherical ICs to facilitate many different configurations. To this end, the apparatus includes an enclosure which may be used to hold and secure one or more spherical ICs and to connect to a device such as a printed circuit board. The enclosure includes two groups of electrical contact points. These contact points may be solder bumps, pads, leads, or any other type of connector. One group of contact points on the enclosure aligns and connects with a corresponding set of contact points on the first spherical shaped IC and the other group of contact points on the enclosure aligns and connects with a corresponding set of contact points on the other device (e.g., a second spherical shaped IC).

The two groups of enclosure contact points are interconnected with each other through a circuit located inside the enclosure. The circuit may contain a combination of conductors and/or circuit boards to direct the interconnections. As a result, alignment is no longer required by the contact points on the spherical shaped IC and the other device.

DESCRIPTION OF THE EMBODIMENTS

Figure 2:
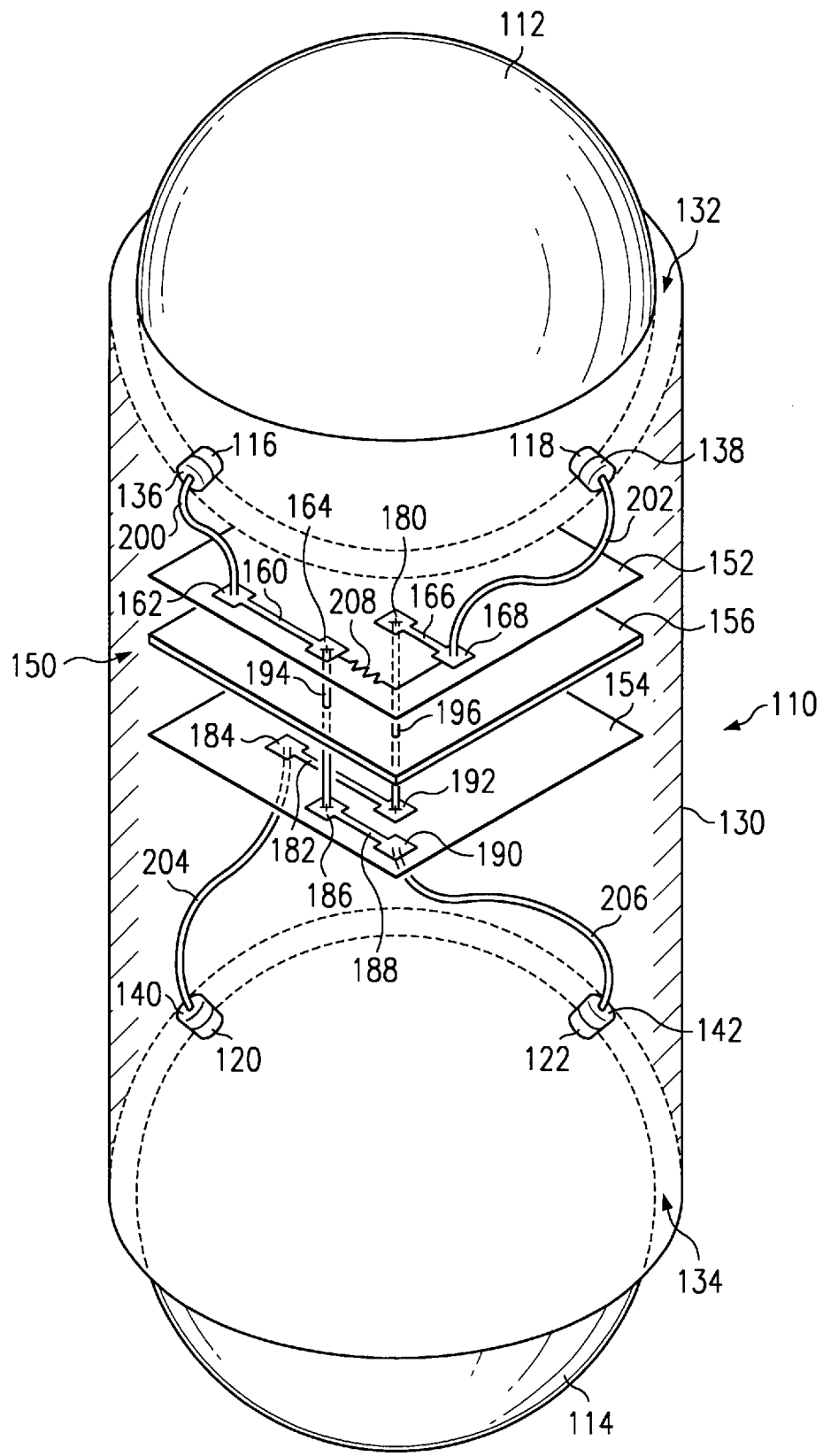
FIG. 2 illustrates one embodiment of an adapter for connecting two spherical ICs, the adapter implementing features of the invention.

Referring to FIG. 2, the reference numeral 110 refers, in general, to one embodiment of an adapter for connecting a first spherical IC 112 to a second spherical IC 114. It is understood that the adapter 110 may be used to interconnect one or more different spherical ICs and/or devices such as printed circuit boards. Also, the number of interconnects for the adapter 110 has been reduced to help clarify the invention, it being understood that different quantities and types of interconnects are anticipated.

The first spherical IC 112 has two solder bumps 116, 118 for externally connecting circuits integrated on the spherical IC. Likewise, the second spherical IC 114 has two solder bumps 120, 122 for externally connecting circuits integrated therein. The solder bumps in the present embodiment serve as leads for the spherical ICs 112, 114. The exact electrical purpose, or signal name, of the solder bumps 116, 118, 120, 122 is not important, but for the sake of example, have the following denotation:

TABLE 1

| Bump # | Signal Name |
|---|---|
| 116 | Power |
| 118 | Clock |
| 120 | Clock |
| 122 | Power |

Figure 1:
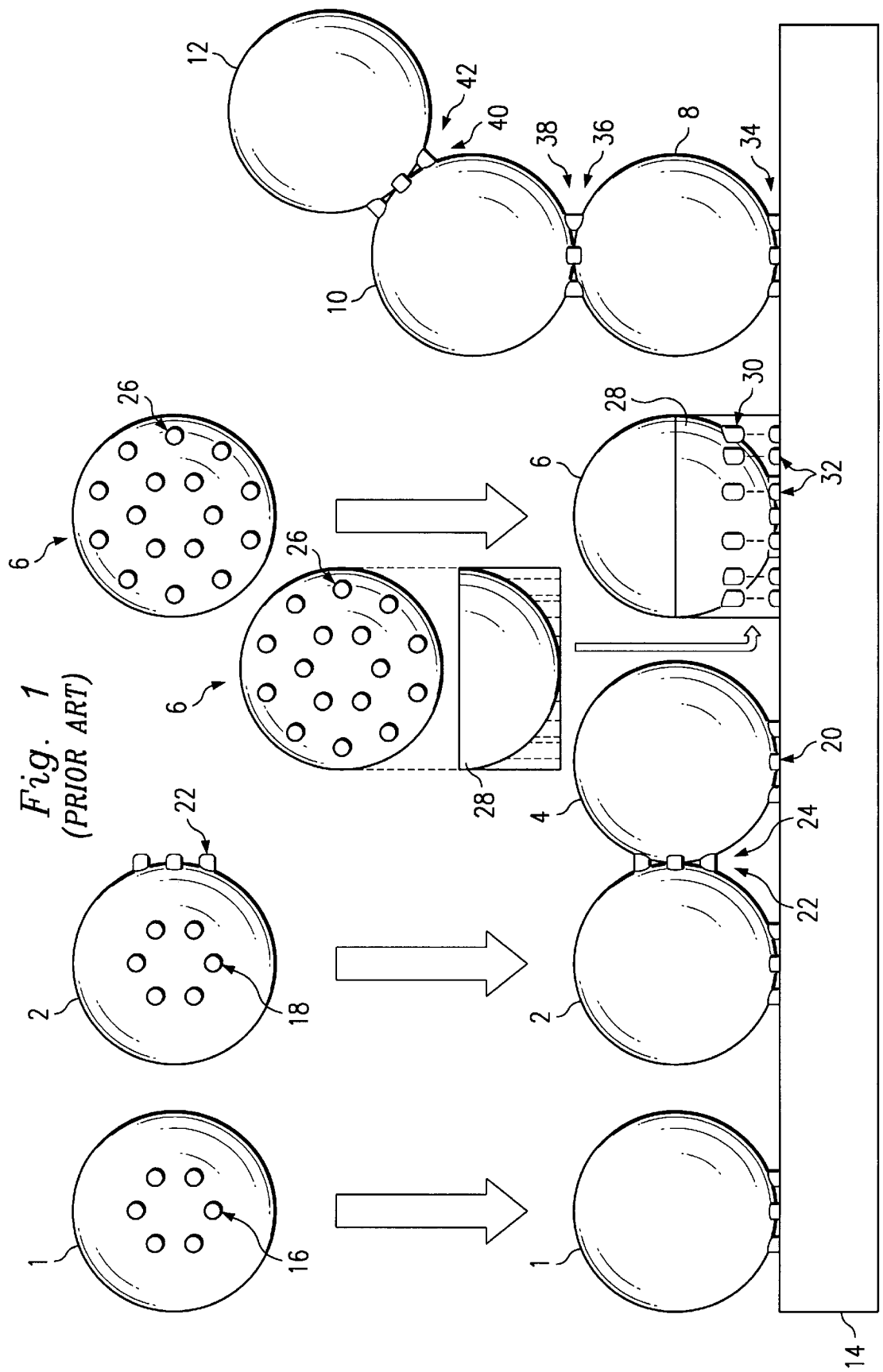
FIG. 1 illustrates a prior art method for attaching spherical ICs to each other and to a circuit board.

It is apparent from FIG. 1 that if the first spherical IC 112 was connected directly to the second spherical IC 114 (i.e., if the adapter 110 was not present and the spacing between solder bumps 116 and 118 was the same as the spacing between solder bumps 120 and 122), solder bumps 116 and 120 would align and solder bumps 118 and 122 would align. In the present embodiment, this alignment is not desired. Instead, it is desired that solder bump 116 align with solder bump 122, and solder bump 118 align with solder bump 120.

The adapter 110 correctly aligns the solder bumps 116, 118, 120, 122 so that a desired connection is made. The adapter 110 includes a cover 130 having two retaining cups 132, 134 for holding and supporting the spherical ICs 112, 114, respectively. In the present embodiment, the retaining cups 132, 134 do not actually come into contact with the spherical ICs 112, 114. Instead, the spherical ICs are supported by one or more solder bumps, discussed in greater detail below, being soldered onto solder pads inside the retaining cups.

Attached to the retaining cups 132 and 134 are solder pads 136, 138 and 140, 142, respectively. The solder pads 136, 138, 140, 142 are positioned so that when the spherical ICs 112, 114 are placed in the retaining cups 132, 134, respectively, the bumps align as follows:

TABLE 2

| Spherical IC Bump # | Retaining Cup Pad # |
|---|---|
| 116 | 136 |
| 118 | 138 |

TABLE 2-continued

| Spherical IC Bump # | Retaining Cup Pad # |
|---|---|
| 120 | 140 |
| 122 | 142 |

Mounted inside the cover 130 is a circuit board 150. The circuit board 150 is mounted in a conventional manner, such as by epoxy or by support structures (not shown). In the present embodiment, the circuit board 150 includes three layers: two conducting layers 152, 154 surrounding an insulating layer 156. It is understood that different types of circuit boards and mounting methods may also be used and the circuit board may be allowed to float inside the cover 130.

The conducting layers 152, 154 have a plurality of metal lines and structures formed therein. On conducting layer 152, a metal line 160 connects an external pad 162 with a via pad 164 and a metal line 166 connects an external pad 168 with a via pad 180. On conducting layer 154, a metal line 182 connects an external pad 184 with a via pad 186 and a metal line 188 connects an external pad 190 with a via pad 192. Via pads 180 and 186 are electrically connected with a via 194, and via pads 164 and 192 are electrically connected with a via 196.

In the embodiment of FIG. 2, the solder pads 136, 138, 140, 142 are connected to external pads 162, 168, 184, 190 with conductors 200, 202, 204, 206, respectively. As a result, there is now an electrical connection between the two power solder bumps 116, 122 and the two clock-signal solder bumps 118, 120. In other embodiments, certain structures may be included on the circuit board 150. For example, a pull-up resistor 208 may be electrically connected between via pad 164 and external pad 168 or between via pad 164 and external pad 162. For another example, a de-coupling capacitor (not shown) may also be incorporated onto the circuit board 150.

Figure 3:
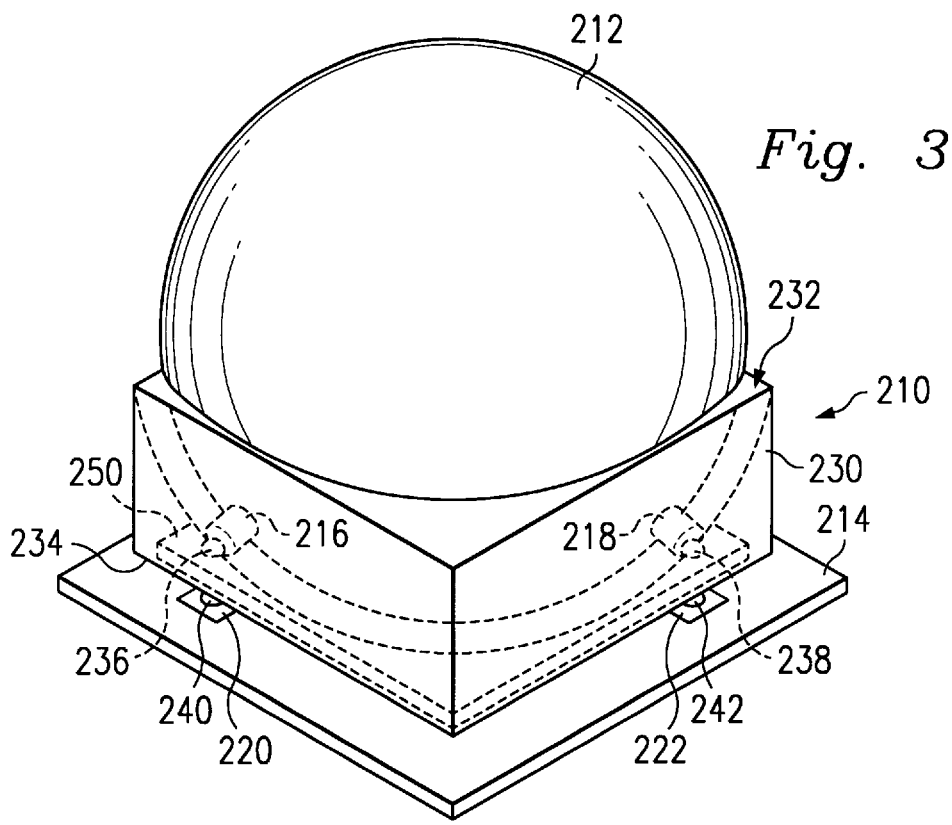
FIG. 3 illustrates another embodiment of the adapter for connecting a spherical IC to a circuit board.

Referring to FIG. 3, the reference numeral 210 refers, in general, to another embodiment of an adapter for connecting a spherical IC 212 to a circuit board 214. The spherical IC 212 has two leads 216, 218 for externally connecting circuits integrated on the spherical IC. Likewise, the circuit board 214 has two solder pads 220, 222 for externally connecting circuits integrated therein. The exact electrical purpose of leads 216, 218 and solder pads 220, 222 is not important, but for the sake of example, will have the same denotation as the solder bumps 116, 118, 120, 122, respectively, as shown in Table 1, above.

The adapter 210 correctly aligns the leads 216, 218 and solder pads 220, 222 so that a desired connection is made. In the present embodiment, the adapter 210 includes a cover 230 having a retaining cup 232 for holding and supporting the spherical IC 212, and a bottom surface 234 for connecting with the circuit board 214. A bottom portion of spherical IC 212 rests directly on the retaining cup 232.

Attached to the retaining cup 232 and bottom surface 234 are solder bumps 236, 238 and 240, 242, respectively. The solder bumps 236, 238 are positioned so that when the spherical IC 212 is placed in the retaining cup 232, and the bottom surface 234 is placed on the circuit board 214, the bumps align as follows:

TABLE 3

| Spherical IC Lead # | Retaining Cup Bump # |
|---|---|
| 216 | 236 |
| 218 | 238 |

TABLE 4

| Circuit Board Pad # | Bottom Surface Bump # |
|---|---|
| 220 | 240 |
| 222 | 242 |

The leads 216, 218 and pads 220, 222 are then soldered to the bumps 236, 238, 240, 242, respectively.

Mounted inside the cover 230 is a circuit board 250. In the present embodiment, the circuit board 250 is similar to the circuit board 150 (FIG. 2) in that it includes multiple layers. It is understood that different types of circuit boards may also be used. However, instead of having conductors between the circuit board and the solder bumps (such as conductors 200, 202, 204, 206 of FIG. 2), in the present embodiment, the solder bumps 236, 238, 240, 242 are connected directly to the circuit board 250. In this way, the overall size of the adapter 210 is reduced.

Figure 4:
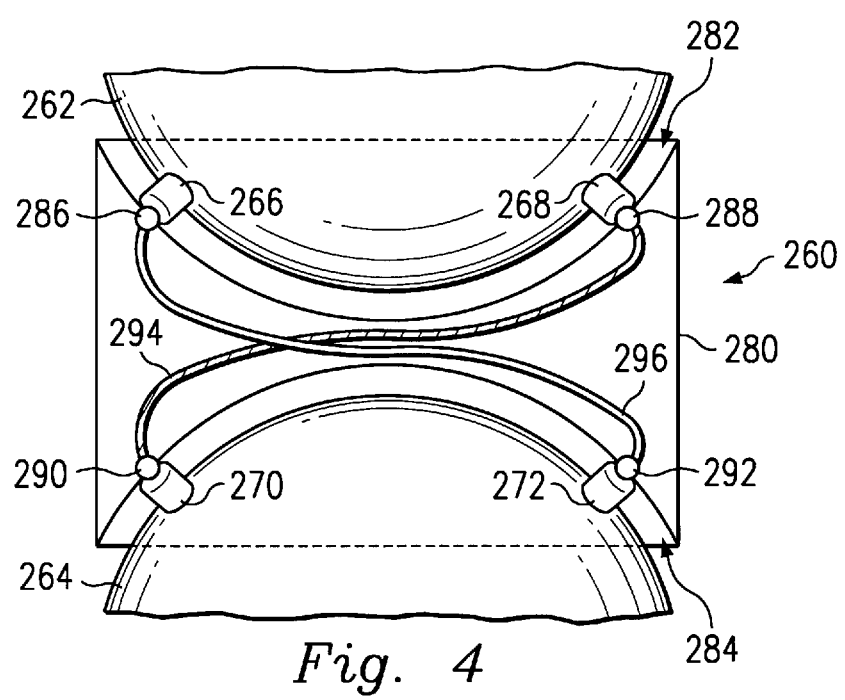
FIG. 4 illustrates yet another embodiment of an adapter for connecting two spherical ICs.

Referring to FIG. 4, the reference numeral 260 refers, in general, to yet another embodiment of an adapter for interconnecting two spherical ICs 262, 264. The spherical ICs 262 and 264 each have two solder pads 266, 268 and 270, 272, respectively. The exact electrical purposes for the solder pads 266, 268 and 270, 272 are not important, but for the sake of example, will have the same denotation as the solder bumps 116, 118, 120, 122, respectively, as shown in Table 1, above.

The adapter 260 correctly aligns the solder pads 266, 268, 270, 272 so that a desired connection is made. In the present embodiment, the adapter 260 includes a cover 280 having two retaining cups 282, 284 for holding and supporting the spherical ICs 262, 264, respectively.

Attached to the retaining cups 282 and 284 are solder bumps 286, 288 and 290, 292, respectively. The solder bumps 286, 288 are positioned so that when the spherical ICs 262, 264 are placed in the retaining cups 282, 284, the bumps align as follows:

TABLE 5

| Spherical IC Pad # | Retaining Cup Bump # |
|---|---|
| 266 | 286 |
| 268 | 288 |
| 270 | 290 |
| 272 | 292 |

Inside the cover 280 is a plurality of conductors 294, 296. The conductor 294 electrically connects solder bumps 288 and 290; the conductor 296 electrically connects solder bumps 286 and 292. In the present embodiment, there is no circuit board inside the cover. Instead, the conductors wind around each other so that the solder pads 266–272 are appropriately connected.

It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for electrically connecting a first spherical shaped integrated circuit (IC) to another device, the apparatus comprising:

an enclosure;

a first group of electrical contact points attached to the enclosure for connecting with a second group of electrical contact points on the spherical shaped IC;

a third group of electrical contact points attached to the enclosure for connecting with a fourth group of electrical contact points on the device, wherein the second group of electrical contact points are not aligned with the fourth group;

means for electrically connecting the first group of electrical contact points with the third group of electrical contact points.

2. The apparatus of claim 1 wherein the enclosure includes a retaining cup for holding and securing the spherical shaped IC.

3. An apparatus for electrically connecting a first spherical shaped integrated circuit (IC) to another device, the apparatus comprising:

an enclosure physically connected to the device;

a first group of electrical contact points attached to the enclosure for connecting with a second group of electrical contact points on the spherical shaped IC;

a third group of electrical contact points attached to the enclosure for connecting with a fourth group of electrical contact points on the device, wherein the second group of electrical contact points are not aligned with the fourth group;

means for electrically connecting the first group of electrical contact points with the third group of electrical contact points wherein the device is either a second spherical shaped IC or a circuit board.

4. The apparatus of claim 3 wherein each of the electrical connections between the attached electrical contact points utilize solder bumps.

5. The apparatus of claim 3 wherein the means for electrically connecting includes a plurality of conductors contained within the enclosure.

6. The apparatus of claim 3 wherein the means for electrically connecting includes a circuit board contained within the enclosure.

7. The apparatus of claim 6 wherein the circuit board includes a plurality of traces and one or more electrical structures.

8. The apparatus of claim 3 wherein the means for electrically connecting includes a circuit board and a plurality of conductors, all contained within the enclosure.

9. The apparatus of claim 8 wherein the circuit board includes at least one electrical device.

10. The apparatus of claim 3 wherein the enclosure includes a retaining cup for holding and securing the spherical shaped IC.

11. A method for electrically connecting a first spherical shaped integrated circuit (IC) to another device, the method comprising:

supporting the first spherical shaped IC with an enclosure;

electrically contacting predetermined solder bumps on the first spherical shaped IC and the device with solder pads connected to the enclosure;

electrically connecting a first solder pad electrically contacting a first predetermined solder bump on the first spherical shaped IC with a second solder pad electrically contacting a first predetermined solder bump on the device;

electrically connecting a third solder pad electrically contacting a second predetermined solder bump on the first spherical shaped IC with a fourth solder pad electrically contacting a second predetermined solder bump on the device;

wherein the first predetermined solder bump on the first spherical shaped IC is physically aligned with the second predetermined solder bump on the device.

12. The method of claim 11 further comprising:

electrically connecting one or more electrical structures between the first and second solder pads.

13. The method of claim 11 wherein the steps for electrically connecting utilize a circuit board and a plurality of conductors, all contained within the enclosure.

14. The method of claim 11 further comprising:

thermally connecting the predetermined solder bumps on the first spherical shaped IC and the device with the electrically corresponding solder pads.

15. The method of claim 11 wherein the device is a circuit board.

16. The method of claim 11 wherein the device is a second spherical shaped IC.

17. The method of claim 11 wherein the device is a chip.

18. An adapter for electrically connecting two spherical shaped integrated circuit (ICs) comprising:

an enclosure including two retaining cups for holding and securing the two spherical shaped ICs, respectively;

a first group of electrical contact points attached to the enclosure for connecting with electrical contact points on the first spherical shaped IC;

a second group of electrical contact points attached to the enclosure for connecting with electrical contact points on the second spherical shaped IC;

a circuit for electrically connecting the first group of electrical contact points with the second group of electrical contact points.

19. The adapter of claim 18 further connecting the two spherical shaped ICs to a circuit board contained within the enclosure.

20. The apparatus of claim 19 wherein the circuit board includes a plurality of traces and one or more electrical structures.

21. The adapter of claim 18 wherein the second group of electrical contact points are not aligned with the first group.

22. The apparatus of claim 18 wherein the circuit for electrically connecting includes a plurality of conductors contained within the enclosure.

23. The apparatus of claim 18 wherein the circuit for electrically connecting includes a circuit board contained within the enclosure.

* * * * *